United States Patent
Huang et al.

(10) Patent No.: US 6,603,366 B2
(45) Date of Patent: Aug. 5, 2003

(54) TRIMMABLE OSCILLATOR

(75) Inventors: Congzhong Huang, Plano, TX (US); Fredrick W. Trafton, Lewisville, TX (US); Marcus M. Martins, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 09/928,041

(22) Filed: Aug. 10, 2001

(65) Prior Publication Data

US 2003/0030499 A1 Feb. 13, 2003

(51) Int. Cl.[7] .......................................... H03K 3/0231
(52) U.S. Cl. .................... 331/111; 331/135; 331/44; 331/143
(58) Field of Search .................. 331/111, 135, 331/44, 108 A, 181, 143

(56) References Cited

U.S. PATENT DOCUMENTS

| | | | | |
|---|---|---|---|---|
| 3,824,494 A | * | 7/1974 | Wilcox ........................ 331/111 |
| 3,879,684 A | * | 4/1975 | Sanderson .................... 331/111 |
| 3,967,216 A | * | 6/1976 | Sakamoto et al. ............ 331/111 |
| 4,524,334 A | * | 6/1985 | Brajder et al. ............... 331/135 |
| 4,549,150 A |   | 10/1985 | Oliver |
| 4,594,565 A | * | 6/1986 | Barreras ...................... 331/111 |
| 4,623,851 A | * | 11/1986 | Abou ........................... 331/111 |
| 4,723,114 A | * | 2/1988 | D'Arrigo et al. ............ 331/111 |
| 4,871,985 A | * | 10/1989 | Sempel ........................ 331/111 |
| 5,491,456 A |   | 2/1996 | Kay et al. |
| 5,565,819 A |   | 10/1996 | Cooper |
| 5,670,915 A |   | 9/1997 | Cooper et al. |
| 5,880,643 A | * | 3/1999 | Bjork et al. ................... 331/44 |
| 6,326,859 B1 | * | 12/2001 | Goldman et al. ............ 331/111 |

* cited by examiner

Primary Examiner—Michael Tokar
Assistant Examiner—Lam T Mai
(74) Attorney, Agent, or Firm—W. Daniel Swayze, Jr.; W. James Brady; Frederick J. Telecky, Jr.

(57) ABSTRACT

The present invention relates to a trimmable oscillator circuit which comprises a comparator circuit operable to compare an output voltage of the oscillator circuit to a reference voltage and output a control signal in response thereto. The oscillator circuit further comprises an output capacitor, wherein a voltage at a node of the capacitor comprises the output voltage of the oscillator circuit, and the oscillator circuit also comprises a selectively trimmable charge/discharge circuit coupled between the comparator circuit and the output capacitor. The charge/discharge circuit is operable to charge or discharge the output capacitor based on the control signal, wherein a rate of charge or discharge is dictated by one or more user selectable control signals. Thus an oscillation frequency of the oscillator circuit may be trimmed.

18 Claims, 6 Drawing Sheets

TRIMMABLE OSCILLATOR

FIELD OF THE INVENTION

The present invention relates generally to the field of integrated circuits, and more particularly to a system and method of providing an oscillator having an oscillating output signal associated therewith, wherein a frequency thereof may be adjusted via a trimming circuit.

BACKGROUND OF THE INVENTION

Oscillator circuits are implemented in many different applications in the field of electronics and telecommunications. Various classes of oscillator circuits exist; one type of oscillator is an RC oscillator circuit. RC oscillator circuits typically include control circuitry which is coupled to a series resistor-capacitor (RC) network. The control circuit alternately charges or discharges the voltage across the capacitor through the resistor to generate an oscillating signal across the capacitor. The frequency of the oscillating signal is dictated by the time constant of the RC network (often times referred to as the RC time constant).

One exemplary conventional RC oscillator circuit is illustrated in prior art FIG. 1, and designated at reference numeral 10. The prior art oscillator circuit 10 includes two comparator circuits 12 and 14 that compare the output voltage across an output capacitor 16 to respective reference voltages, and generate control output signals to a latch 18. The latch 18 outputs a charge or discharge voltage which feeds the resistor 20 that together with the capacitor 16 forms the RC network. Thus a rate at which the voltage varies across the capacitor 16 is a function of the RC time constant of the resistor 20 and the capacitor 16.

The two comparator circuits 12 and 14 vary between a top and bottom threshold value (e.g., $V_H$ and $V_L$). Thus when the output voltage has increased to $V_H$ as the capacitor 16 charges, the output of the comparator 12 trips, thus signals that a discharge operation should commence. Similarly, when the output of the capacitor 16 falls below $V_L$ as the capacitor discharges, the output of the comparator circuit 14 trips, thus signaling that a charging operation should commence.

Although the prior art oscillator circuit 10 of FIG. 1 is acceptable for many applications, the circuit 10 requires use of two comparators to control the charge/discharge of the capacitor 16 within a given voltage range. In addition, the oscillation frequency dictated by the RC time constant in circuit 10 is fixed. Consequently, if process variations, supply variations, or varying application needs require a variation in the oscillator output frequency, the circuit 10 proves unacceptable.

Thus, there is a need in the art for a method of providing high speed sampling without harmonic distortion on the output of sampling circuits.

SUMMARY OF THE INVENTION

The present invention relates generally to an RC type oscillator circuit, wherein a rate of charge and discharge of the output capacitor may be controlled, thereby allowing for frequency trimming thereof.

According to one aspect of the present invention, a trimmable oscillator circuit comprises a selectively adjustable charge/discharge circuit which is operable in a charging mode and a discharging mode. The rate of charging or discharging of the capacitor (which dictates the output oscillation frequency of the oscillator) may be adjusted in accordance with one or more user selectable control signals which operate to adjust a charging resistance or a discharge resistance associated with the capacitor, thereby allowing the frequency of the oscillator circuit to be trimmed.

According to another aspect of the present invention, the charge/discharge circuit comprises a selectively trimmable charge circuit portion. The charge circuit comprises a plurality of differing value resistances which are selectively coupled to the output capacitor through a base charge resistance. One of the resistances is then coupled to the capacitor through the base charge resistance in response to the one or more user selectable control signals, thereby coupling a unique resistance value to the capacitor to control a charging rate of the capacitor via the unique RC time constant.

According to still another aspect of the present invention, each of the plurality of differing value charge resistances are coupled in series with a transistor and each serially coupled resistance/transistor pair are coupled together in a parallel component arrangement and in turn coupled to the base charge resistance. The transistors are controlled by the one or more user selectable control signals and thus operate to selectively couple one of the differing value charge resistances to the base charge resistance. In addition, the parallel arrangement reduces the number of series switches needed to trim the charging resistance to one, thereby reducing the total $R_{DS(ON)}$ of the charge circuit portion, and making the circuit advantageous for low supply voltage applications.

According to another aspect of the present invention, the charge/discharge circuit comprises a selectively trimmable discharge circuit portion. The discharge circuit comprises a plurality of differing value discharge resistances which are selectively coupled to the output capacitor through a base discharge resistance. One of the discharge resistances is then coupled to the capacitor through the base discharge resistance in response to the one or more user selectable control signals, thereby coupling a unique resistance value to the capacitor to control a discharge rate of the capacitor via the unique RC time constant.

According to yet another aspect of the present invention, each of the plurality of differing value discharge resistances of the discharge circuit portion are coupled in series with a transistor and each serially coupled resistance/transistor pair are coupled together in a parallel component arrangement and in turn coupled to the base discharge resistance. The transistors are controlled by the one or more user selectable control signals and thus operate to selectively couple one of the differing value discharge resistances to the base discharge resistance. In addition, the parallel arrangement reduces the number of series switches needed to trim the discharge resistance to one, thereby reducing the total $R_{DS(ON)}$ of the discharge circuit portion, and making the circuit advantageous for low supply voltage applications.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The present invention is directed to a trimmable RC-type oscillator circuit in which the output frequency associated therewith may be adjusted via one or more selectable control signals. In particular, the oscillator circuit includes a trimmable charge circuit and a trimmable discharge circuit which are each operable to couple a resistance (charging resistance or discharge resistance, respectively) having a value dictated by the selectable control signal(s) in order to dictate a rate of charging and discharging of the capacitor, thereby influencing the oscillation frequency of the signal thereacross. In addition, according to one exemplary aspect of the present invention, the charge and discharge circuits are configured such that the activation resistance associated therewith is limited to the $R_{DS(ON)}$ of a single transistor, thereby making the oscillator circuit advantageous in low supply voltage applications.

Figure 2:
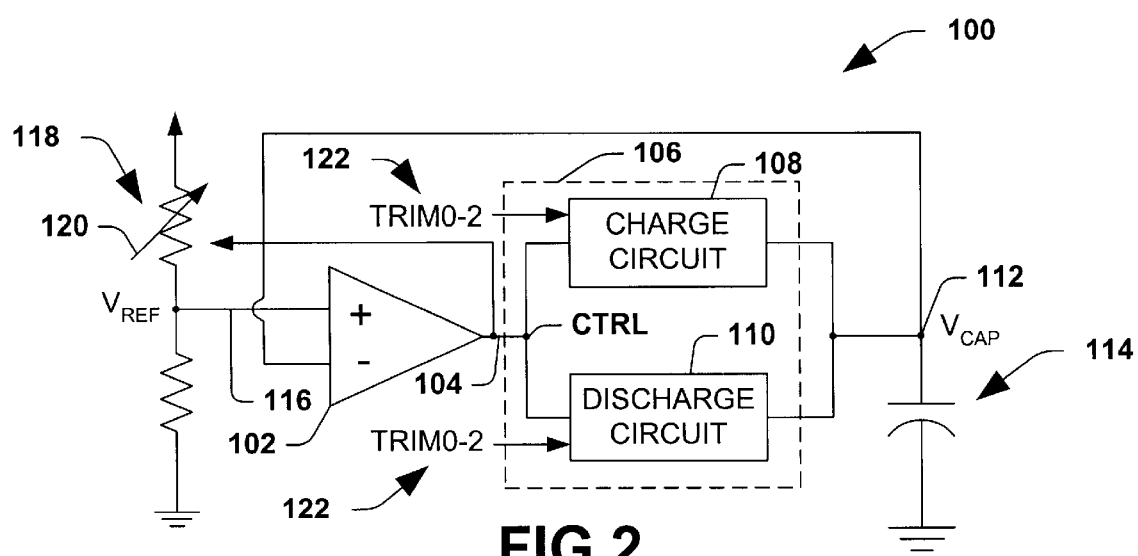
FIG. 2 is a schematic diagram illustrating a trimmable RC oscillator circuit according to the present invention.

Turning now to the figures, FIG. 2 is a combined block diagram and schematic diagram illustrating an RC-type oscillator circuit 100 according to one exemplary aspect of the present invention. The oscillator circuit 100 comprises a comparator circuit 102 having an output 104 coupled to a selectively trimmable charge/discharge circuit 106. The trimmable charge/discharge circuit 106 comprises a trimmable charge circuit portion 108 and a trimmable discharge circuit portion 110, respectively. Each circuit portion 108 and 110 is coupled to a node 112 of an output capacitor 114, across which the output signal ($V_{CAP}$) is taken.

Figure 1:
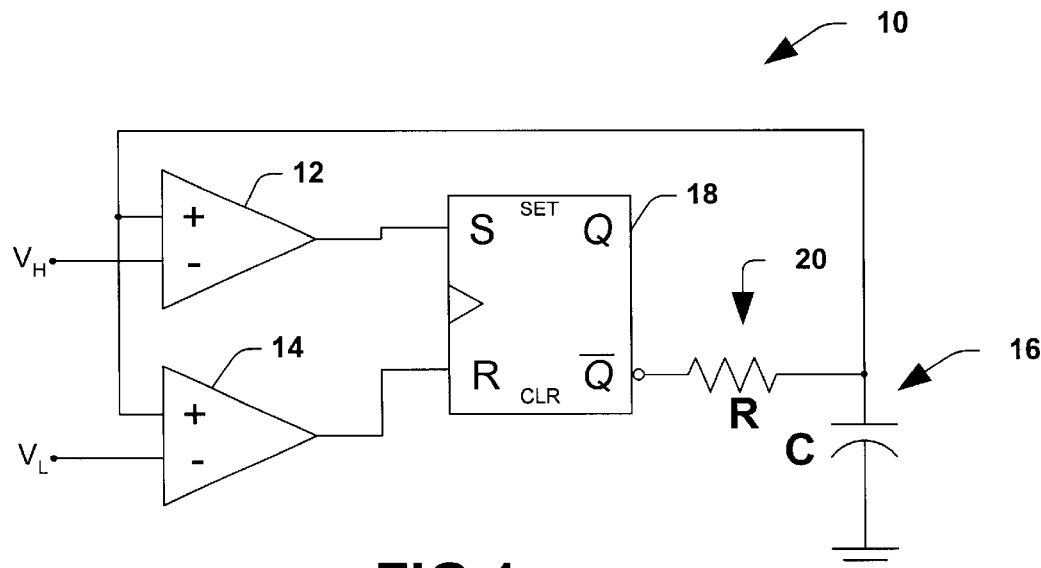
FIG. 1 is a schematic diagram illustrating a prior art RC type oscillator circuit.

The comparator circuit 102 compares the output signal 112 ($V_{CAP}$) to a reference voltage value 116 generated by a reference voltage generation circuit 118. According to one exemplary aspect of the present invention, the reference voltage generation circuit 118 comprises a resistor divider network having a portion 120 thereof which exhibits a variable resistance which is a function of the control signal 104 (CTRL). Thus the reference voltage $V_{REF}$ at the input terminal 116 will vary between two values, thus allowing the output voltage ($V_{CAP}$) at node 116 to vary or oscillate between two values without requiring two comparator circuits, as illustrated in the prior art oscillator circuit of FIG. 1.

According to another exemplary aspect of the present invention, the charge/discharge circuit 106 of FIG. 2 has charge and discharge portions 108 and 110 that are selectively enabled by the output 104 (CTRL) of the comparator circuit 102. Further, each circuit portion 108 and 110 is operable to configure a charging resistance or a discharge resistance, respectively, which is uniquely associated with one or more selectable control signals 122 (e.g., TRIM0–2). Thus, based on the output control signal 104 (CTRL) and the selectable control signals 122 (TRIM0–2), either a unique charging resistance value or a unique discharge resistance value will be coupled to the node 112 of the output capacitor 114, thereby generating an RC time constant associated therewith to adjust the rate of charge and discharge, respectively, and thus the oscillation frequency at node 112.

Figure 3:
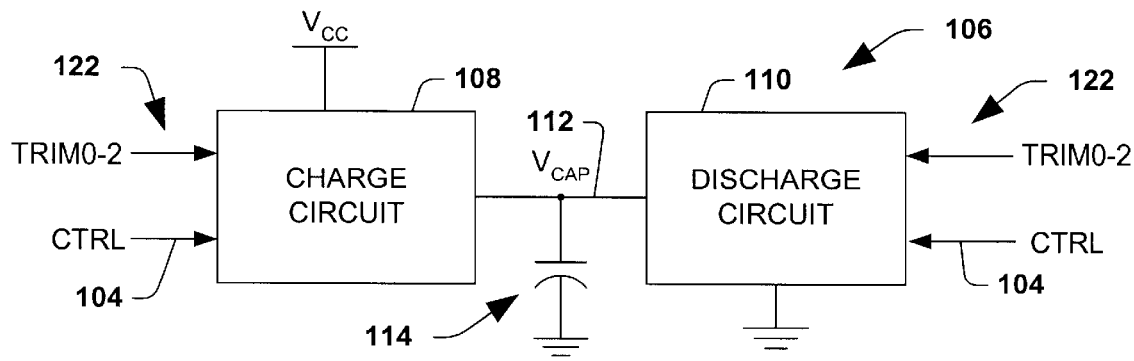
FIG. 3 is a combined block and schematic diagram illustrating a trimmable charge circuit portion and trimmable discharge circuit portion of the RC oscillator circuit according to one exemplary aspect of the present invention.

Turning now to FIG. 3, FIG. 3 illustrates in greater detail an exemplary manner in which the charge circuit portion 108 and the discharge circuit portion 110 of the trimmable charge/discharge circuit 106 charge and discharge the output capacitor 114. As illustrated, according to one exemplary aspect of the present invention, the charge circuit portion 108 is coupled between a voltage supply $V_{CC}$ and the node 112 of the capacitor 114.

Based on the selectable control signals 122 (e.g., TRIM0–2), when the control signal 104 is at a predetermined state, the circuit 108 is enabled (and circuit 110 is disabled) and a unique charging resistance is coupled between the supply voltage $V_{CC}$ and the node 112 of the capacitor 114. In such a manner, a user selectable RC charging time constant is established and the voltage at node 112 increases at a rate dictated by that particular RC time constant. Therefore, in one instance at which a relatively small charging resistance value is dictated by the control signals 122, the RC time constant will be small and the node 112 will charge relatively quickly. Conversely, if a relatively large charging resistance value is dictated by the control signals 122, the RC time constant will be large and the node 112 will charge relatively slowly, thereby decreasing a signal frequency thereat.

In addition, according to another aspect of the present invention, FIG. 3 also illustrates the discharge circuit portion 110 coupled between the node 112 of the capacitor 114 and circuit ground. Based on the selectable control signals 122 (e.g., TRIM0–2), when the control signal 104 is at another predetermined state, the discharge circuit 110 is enabled (and the charge circuit 108 is disabled) and a unique discharge resistance is coupled between the node 112 of the capacitor 114 and the circuit ground potential. In such a manner, a user selectable RC discharge time constant is established and the voltage at node 112 decreases at a rate dictated by that particular RC time constant. Therefore, in one instance at which a relatively small discharge resistance is dictated by the control signals 122, the RC time constant will be small and the node 112 will discharge relatively quickly to circuit ground, thereby increasing a frequency thereat. Conversely, if a relatively large discharge resistance value is dictated by the control signals 122, the RC time constant will be large and the node 112 will discharge relatively slowly, thereby decreasing a signal frequency thereat.

Figure 4:
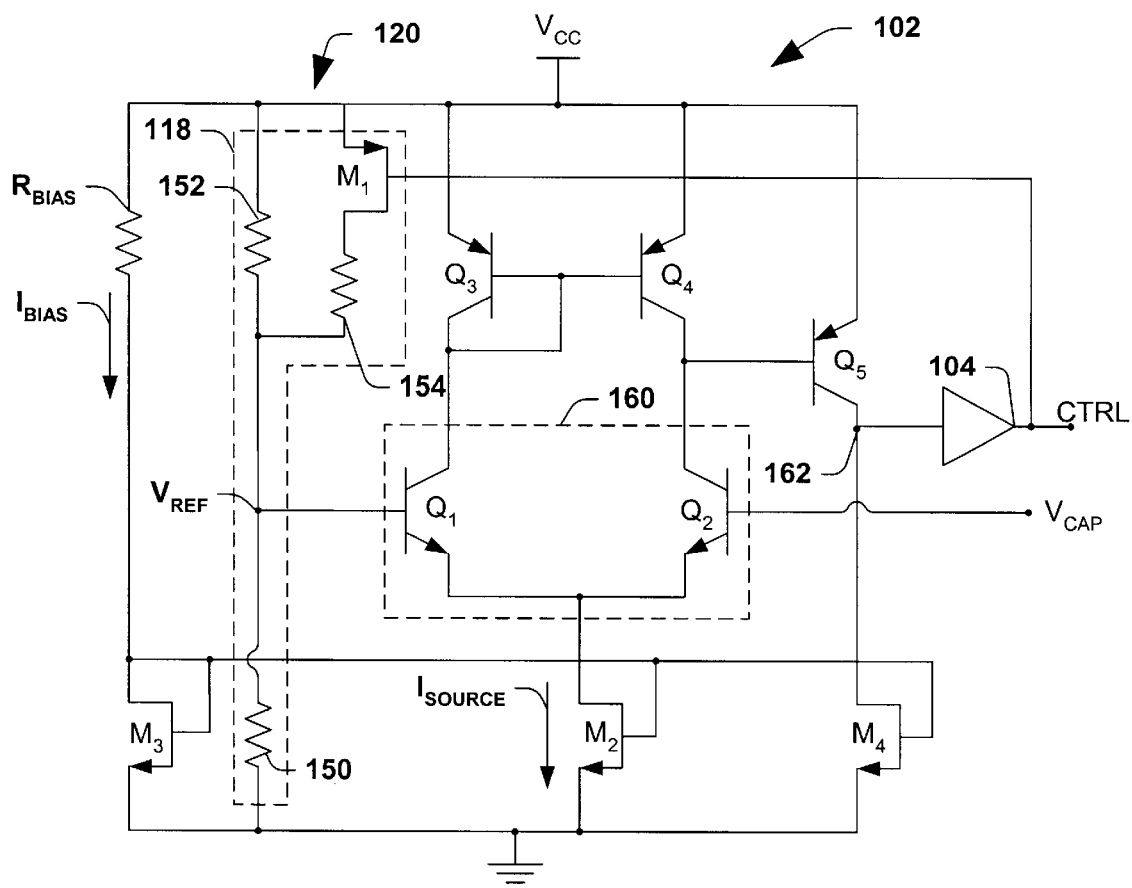
FIG. 4 is a detailed schematic diagram illustrating a comparator circuit generating a control signal for controlling a charging operation and a discharge operation of an RC oscillator circuit according to another exemplary aspect of the present invention.

Turning now to FIG. 4, according to yet another exemplary aspect of the present invention, a more detailed schematic diagram of the comparator circuit 102 and the reference voltage circuit 118 of FIG. 2 is illustrated. The voltage reference circuit 118 comprises a resistor-based voltage divider having a variable resistance upper portion 120 and a lower portion 150, respectively. The upper portion 120 has a first resistance value associated with a resistor 152 when a PMOS transistor $M_1$ is off, and a second resistance value associated with a parallel combination of the resistor 152 and a resistor 154 when the PMOS transistor $M_1$ is on. The state of the PMOS transistor $M_1$ is dictated by the output signal 104 (CTRL) of the comparator circuit 102, and thus as the state of the comparator output switches, the resistance of the upper portion 120 of the voltage divider changes, thereby adjusting the value of the reference voltage $V_{REF}$. In the above manner, the comparator circuit 102 is operable to switch using two different voltage references to control the voltage across the output capacitor 114 within a predetermined range without the need for multiple, dedicated comparators.

The reference voltage $V_{REF}$ is input to a first bipolar transistor $Q_1$, which together with another bipolar transistor $Q_2$ form a differential input pair 160. The output capacitor voltage $V_{CAP}$ is fed back as an input to $Q_2$, and thus the differential pair 160 is operable to compare $V_{CAP}$ to $V_{REF}$. The bipolar transistors $Q_1$ and $Q_2$ collectively conduct a source current $I_{SOURCE}$ through a current source NMOS transistor $M_2$, wherein the source current is dictated by a bias current $I_{BIAS}$ through a bias resistor $R_{BIAS}$ which is mirrored to M2 via another NMOS transistor $M_3$.

When $V_{REF}$ is greater than $V_{CAP}$, $Q_1$ conducts harder than $Q_2$. Additional bipolar transistors $Q_3$ and $Q_4$ behave as an active load. Since $Q_2$ is not conducting very hard, sufficient current is supplied by $Q_4$ and no base current is pulled by another bipolar transistor $Q_5$. Consequently, $Q_5$ is off, and another NMOS transistor $M_4$ mirrored with $M_2$ and $M_3$ pulls a node 162 down, thus causing the comparator output 104 (CTRL) to go low. This control signal CTRL is then fed to the charge/discharge circuit 106 and is operable to disable the discharge portion 110 and enable the charge portion 108, respectively. With the charge circuit portion 108 enabled, the output capacitor 114 begins to be charged and the output voltage $V_{CAP}$ begins to increase.

Note that when the comparator output switches states, for example, when going low, the PMOS transistor $M_1$ turns on, thus decreasing the variable resistance 118 and increasing the reference voltage $V_{REF}$. Therefore, as $V_{CAP}$ increases due to the capacitor 114 charging, the comparator 102 will not trip until $V_{CAP}$ exceeds the new, increased reference voltage value $V_{REF}$.

As $V_{CAP}$ increases due to the charging performed by the charge circuit portion 108, $V_{CAP}$ eventually exceeds $V_{REF}$, wherein transistor $Q_2$ conducts more current than $Q_1$. Consequently, $Q_2$ pulls current from the base of the transistor $Q_5$, thereby causing $Q_5$ to turn on, wherein the comparator output 104 (CTRL) goes high. When CTRL goes high, the control signal disables the charge circuit portion 108 of the charge/discharge circuit 106 and enables the discharge circuit portion 110. Consequently, $V_{CAP}$ will begin to decrease as charge on the output capacitor 114 is discharged, for example, to a circuit ground potential.

As discussed above, based on the state of the control signal (CTRL), the capacitor 114 is either charged, whereby the output 112 ($V_{CAP}$) increases, or discharged, whereby $V_{CAP}$ decreases. In accordance with the present invention, a rate at which the capacitor 114 is charged or discharged may be selectively controlled via selectable control signals 122 (e.g., TRIM0–2). In accordance with one exemplary aspect of the present invention, the selectable control signals 122 may be employed to alter a resistance value coupled to the output capacitor 114 to thereby alter an RC time constant associated therewith. By varying or trimming the rate of charge and discharge of the capacitor 114, the oscillator frequency is varied in a controlled manner.

Figure 5:
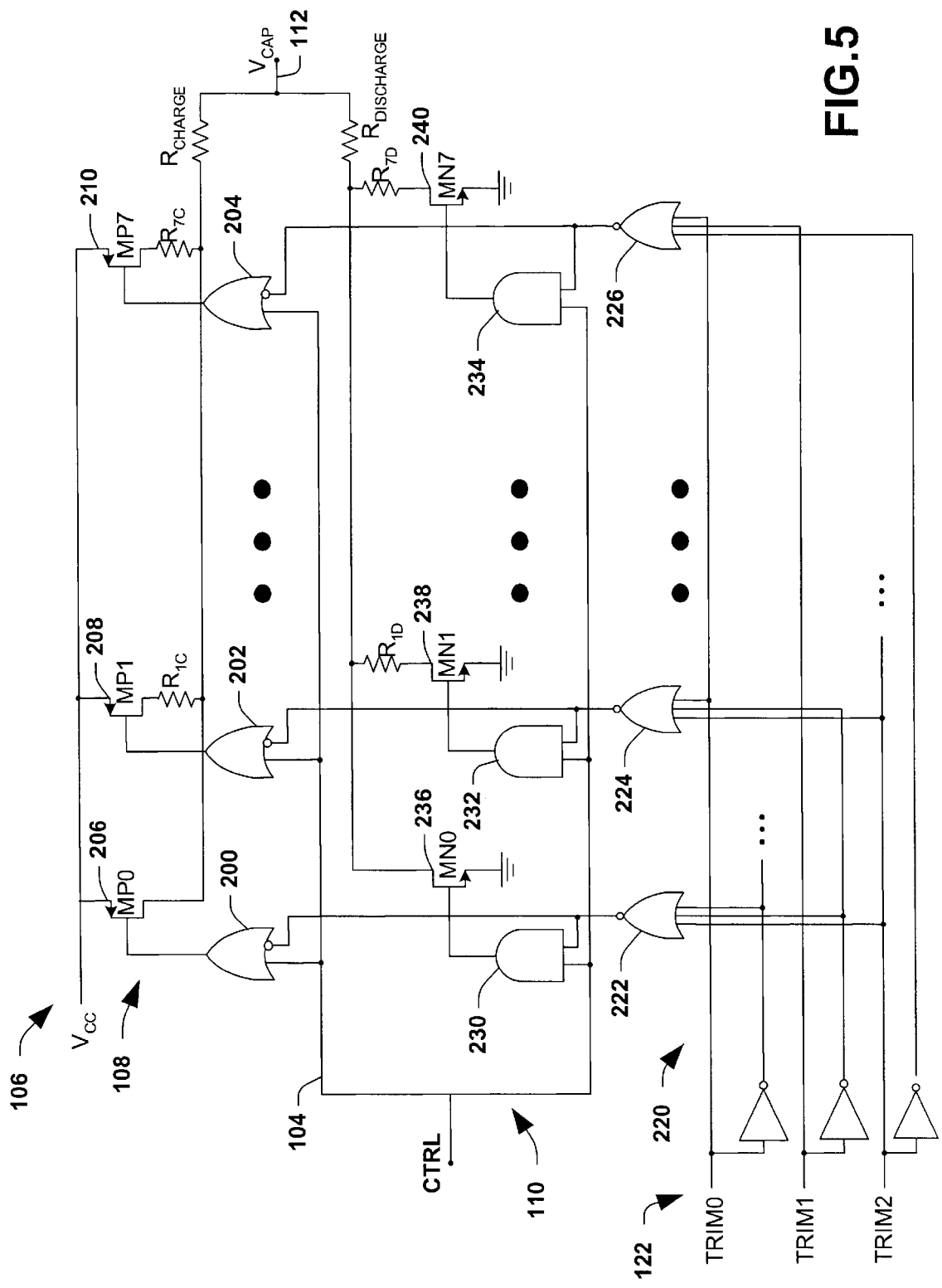
FIG. 5 is a combined schematic and logic diagram illustrating a selectively trimmable charge/discharge circuit operable to adjust a charging resistance or a discharge resistance associated with an RC type oscillator circuit according to an exemplary aspect of the present invention.

FIG. 5 is a detailed schematic diagram illustrating a charge/discharge circuit 106 according to one exemplary aspect of the present invention. The charge/discharge circuit 106 includes a charging circuit portion 108 and a discharge circuit portion 110, respectively. The charging circuit portion 108 comprises a plurality of OR-type logic gates 200, 202 and 204 (e.g., eight gates) that each drive a PMOS-type transistor 206, 208 and 210, respectively. Each of the transistors is coupled to a respective charging resistor $R_{1C}, \ldots R_{7C}$ (wherein $R_{0C}$ associated with the transistor 206 MPO is equal to 0 ohms) in series between a supply voltage potential $V_{CC}$ and a base charge resistance $R_{CHARGE}$ (which is coupled to the output capacitor at the node 112 ($V_{CAP}$). Each of the OR-type logic gates 200, 202 and 204 has a first input coupled to the control signals 104 (CTRL) and a second input coupled to a respective output of a logic network 220. Based on the selectable control signals 122 (TRIM0–2), one output of the logic network 220 is at a high digital value to selectively activate one of the PMOS transistors 206, 208 and 210 via the logic gates 200, 202 and 204.

For example, if the control signal 104 is low and the selectable control signals 122 are such that the output of the gate 222 is high and all the other gates 224 and 226 are low, then the output of the OR-type gate 200 will be low, while the output of OR gates 202 and 204 will be high. Thus the PMOS transistor 206 will conduct while the other transistors 208 and 210 will be off and the total charge resistance will be equal to:

0 ohms+$R_{CHARGE}$=$R_{CHARGE}$.

Alternatively, if CTRL is low and the gate 224 is high while the other gates 222 and 226 are low, the PMOS transistor 208 alone will conduct and the total charge resistance will equal: $R_{1C}$+$R_{CHARGE}$. Accordingly, it can be seen that by modifying the selectable control signals 122 (TRIM0–2), the total charge resistance may be altered, thus allowing for the rate at which the output capacitor 114 will be charged to be varied in a controlled manner.

In FIG. 5, the discharge portion 110 comprises a plurality of AND-type gates 230, 232 and 234 that each drive an NMOS-type transistor 236, 238 and 240, respectively. Each of the NMOS transistors are serially coupled to a respective discharge resistor $R_{1D}, \ldots R_{7D}$ (e.g., $R_{0D}$=0 ohms) and each of the discharge resistors are coupled to a base discharge resistance $R_{DISCHARGE}$ which is coupled to the output node 112 of the output capacitors 114. Based on the CTRL signal 104 and the selectable control signals 122, one of the logic network gates 222, 224 and 226 goes high, which causes the respective AND gate 230, 232 and 236 to go high and turn on a respective NMOS transistor 236, 238 and 240. When the NMOS transistor turns on, the respective discharge resistor is placed in series with the base discharge resistance $R_{DISCHARGE}$ between the output capacitor node 112 and a circuit ground potential for discharge of the capacitor 114.

In operation, for example, if the control signal 104 is high and the selectable control signals 122 are such that the output of the gate 222 is high and all the other gates 224 and 226 are low, then the output of the AND-type gate 230 will be high, while the output of the AND gates 232 and 234 will be low. Thus the NMOS transistor 236 will conduct while the other transistors 238 and 240 will be off and the total discharge resistance will be equal to:

$$0 \text{ ohms} + R_{DISCHARGE} = R_{DISCHARGE}.$$

Alternatively, if CTRL is high and the gate 224 is high while the other gates 222 and 226 are low, the NMOS transistor 238 alone will conduct and the total discharge resistance will equal: $R_{1D} + R_{DISCHARGE}$. Accordingly, it can be seen that by modifying the selectable control signals 122 (TRIM0–2), the total discharge resistance may be altered, thus allowing for the rate at which the output capacitor 114 will be discharged to be varied in a controlled manner.

In the above discussion, the selectable control signals 122 comprised a 3-bit digital word which is operable to select one of eight unique charge or discharge resistance values. As may be appreciated, the selectable control signals 122 may comprise one or more such signals to provide and accommodate varying degrees of adjustability, as may be desired. In addition, while the exemplary circuit 106 of FIG. 5 employed only one resistance in series with its respective base resistance, multiple transistors may be activated concurrently to place a selected number of resistances in parallel with one another, with the parallel combination then coupled in series with its respective base resistance. Any such variation may be employed and is contemplated as falling within the scope of the present invention.

Figure 6:
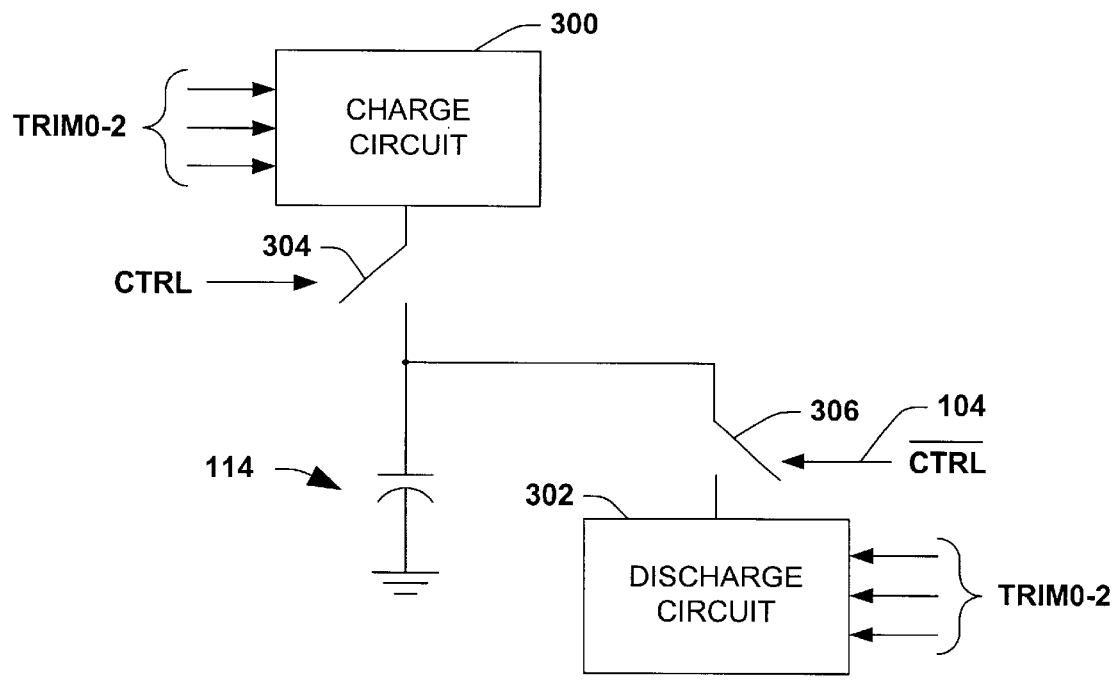
FIG. 6 is a combined block diagram and schematic diagram illustrating one type of architecture for coupling a trimmable charge circuit and a trimmable discharge circuit to an output capacitor.
Figure 7:
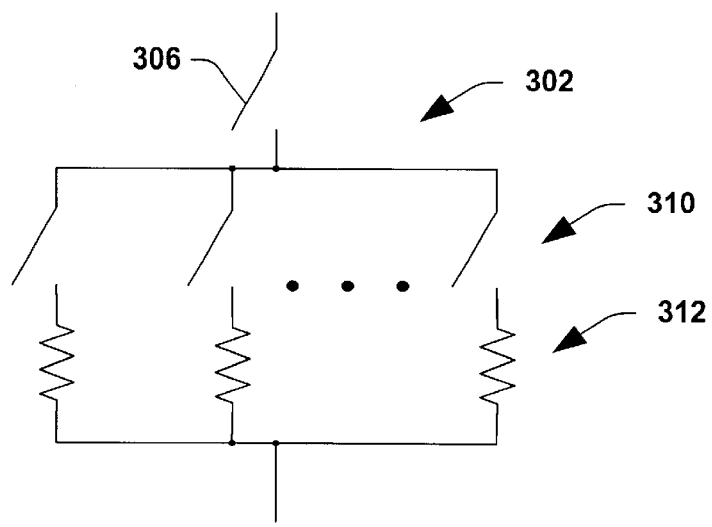
FIG. 7 is a schematic diagram illustrating an effective RDS(ON) of the architecture of FIG. 6.

Another advantageous feature associated with another aspect of the present invention relates to the low on-resistance associated with the charge/discharge circuit 106. In order to fully appreciate the low on-resistance feature of the present invention, another type of switching architecture is illustrated in FIG. 6. Note that in FIG. 6, a selectable or variable charge circuit 300 and a variable discharge circuit 302 are selectively coupled to the output capacitor 114 via switches 304 and 306 controlled by the control signal 104. Note that when one of the circuits 300 or 302 are coupled to the output capacitor 114, an on-resistance associated with the respective activated switch 304 or 306 is coupled in series within the charge or discharge path. For example, as illustrated in FIG. 7, when the discharge circuit 302 is activated by the control signal 104, the switch 306 on-resistance is added to the discharge resistance 312 along with the internal on-resistance 310 of the discharge circuit 302. With the two added on-resistances of the switches 306 and 310, valuable voltage headroom is consumed which can be highly undesirable in low voltage supply oscillator conditions or applications.

Figure 8:
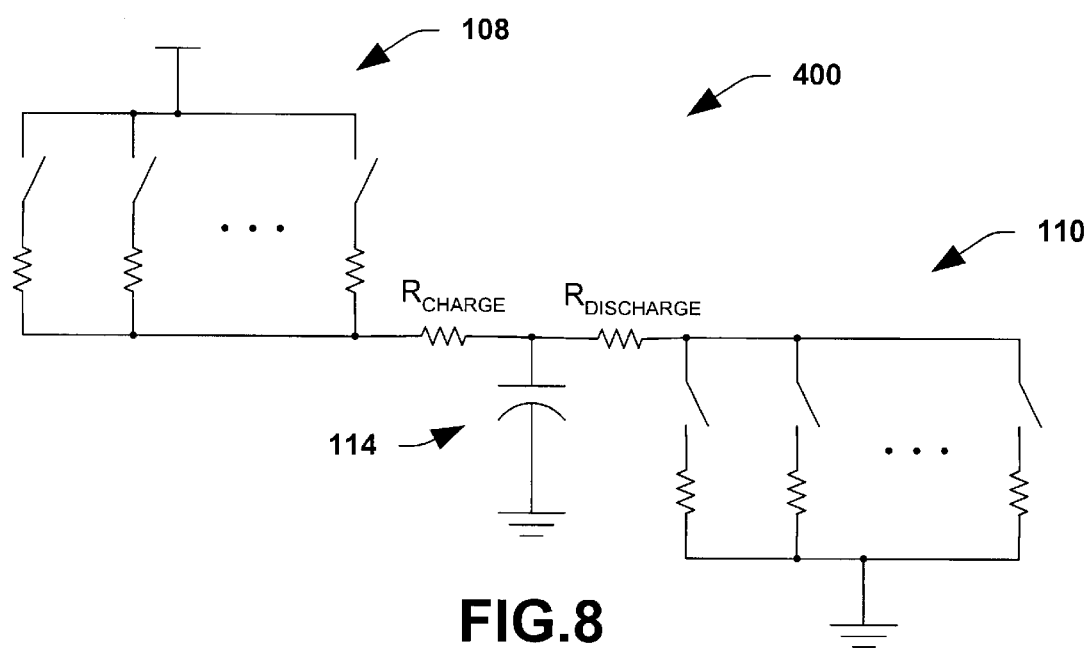
FIG. 8 is a schematic diagram illustrating an effective $R_{DS(ON)}$ of the architecture of the selectively trimmable charge and discharge circuits according to yet another exemplary aspect of the present invention.

The present invention advantageously decreases the on-resistance associated with the activated charge or discharge circuit, as illustrated in FIG. 8. In accordance with one aspect of the present invention, the charge circuit 108 has the various parallel resistance/switch components collectively coupled in series with the charge base resistance, and the discharge circuit 110 has the various parallel resistance/switch components collectively coupled in series with the discharge base resistance. Thus, when one of the circuits 108 and 110 are enabled, the total on-resistance ($R_{DS(ON)}$) associated with the charge or discharge path is only that associated with a single MOS transistor. Thus the present invention provides increased voltage headroom which may be particularly advantageous in low voltage applications.

Figure 9:
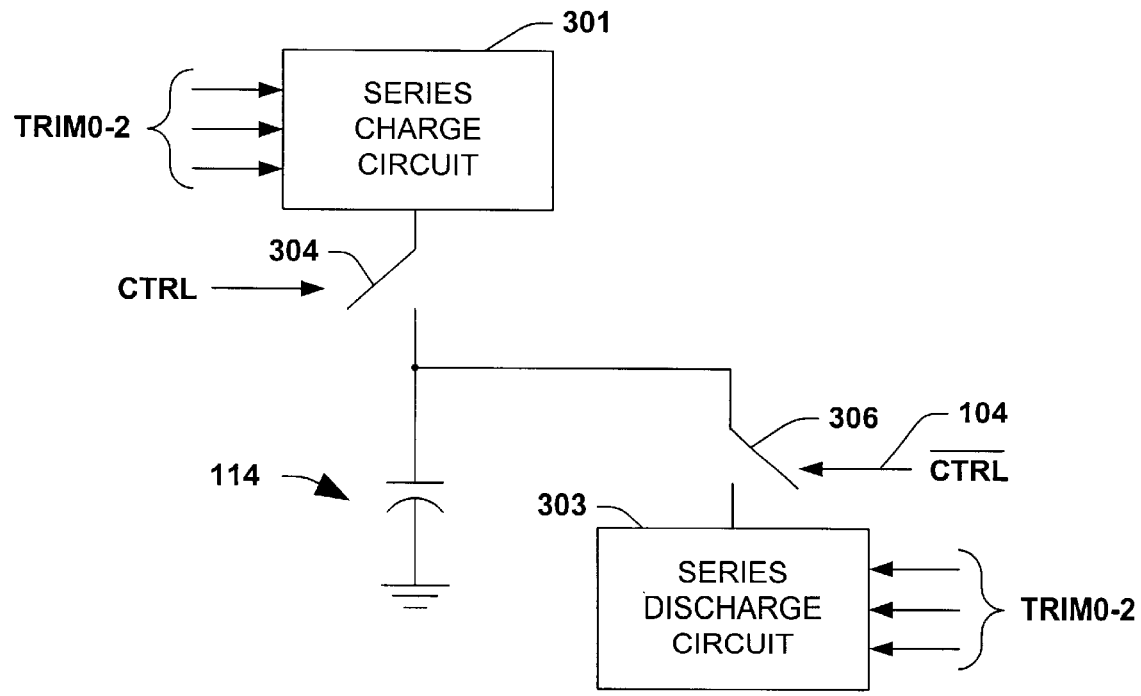
FIG. 9 is a combined block diagram and schematic diagram illustrating another type of architecture for coupling a trimmable charge circuit and a trimmable discharge circuit to an output capacitor.
Figure 10:
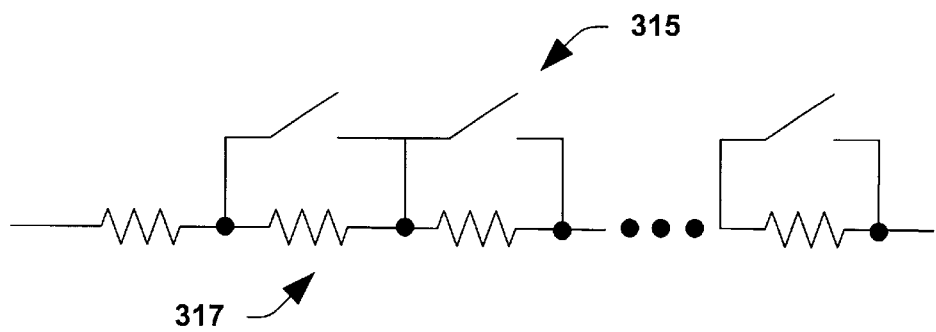
FIG. 10 is a schematic diagram illustrating an effective $R_{DS(ON)}$ of the architecture of FIG. 9.

Another alternative trimming architecture is a series-connected trimmable architecture and is illustrated in FIGS. 9 and 10. Note that in FIG. 9, a series type charge circuit 301 and a series type discharge circuit 303 are selectively coupled to the output capacitor 114 through switches 304 and 306, respectively, which each exhibit an on-resistance (e.g., $R_{DS(ON)}$) when activated. In addition, as illustrated in FIG. 10, the charge circuit 301 and the discharge circuit 303 are series type trimmable circuits, wherein the charge, discharge resistance associated therewith is controlled by the selective activation of switches 315 across respective series-connected resistors 317. In such a case, however, since each switch 315 has an on-resistance associated therewith, the activation of multiple switches 315 is additive, and such resistances must be taken into account to provide for accurate trimming.

Unfortunately, since the switches 315 are typically transistors such as MOS type transistors, the voltages at their respective drain/source terminals will vary about the series chain, and consequently the on-resistance associated with each of the switches 315 will be difficult to control and/or predict accurately. Thus such an architecture makes accurate trimming difficult.

The present invention overcomes the disadvantages associated with the architecture of FIGS. 9 and 10 by making the PMOS switches 206, 208, 210 and the NMOS switches 236, 238, 240 of FIG. 5 coupled to $V_{CC}$ and circuit ground potential, respectively. Accordingly, when the PMOS and NMOS transistor switches are to be activated, they turn on completely in a consistent, predictable manner, thereby improving trimming performance. For example, in the case when a charging event occurs, one of the PMOS transistors (e.g., transistor 208) of FIG. 5) is activated. To activate the transistor 208, the OR gate 202 goes low (e.g., to circuit ground potential); since the source of the PMOS transistor 208 is coupled to $V_{CC}$, the transistor 208 is turned on completely, thus minimizing the on-resistance ($R_{DS(ON)}$) associated therewith. Not only is $R_{DS(ON)}$ minimized, thus providing improved voltage headroom for charging, but the $R_{DS(ON)}$ is predictable, thus ensuring consistency in trimming functionality.

Similarly, in a discharge situation, one of the NMOS transistors 236, 238, 240 will be activated (e.g., transistor 238). Since the transistor 238 has a source terminal coupled to circuit ground, when the AND gate 232 goes high (e.g., to $V_{CC}$) the transistor 238 is turned completely on, thus minimizing the on-resistance ($R_{DS(ON)}$) associated therewith. Furthermore, the $R_{DS(ON)}$ will be consistent. Therefore the present invention exhibits several advantages over other types of trimming architectures.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A trimmable oscillator circuit, comprising:
   a comparator circuit operable to compare an output voltage of the oscillator circuit to a reference voltage and output a control signal in response thereto;
   an output capacitor, wherein a voltage at a node of the capacitor comprises the output voltage of the oscillator circuit; and
   a selectively trimmable charge/discharge circuit coupled between the comparator circuit and the output capacitor, and operable to charge or discharge the output capacitor based on the control signal, and wherein a rate of charge or discharge is dictated by one or more user selectable control signals, thereby dictating a frequency of the output voltage.

2. The trimmable oscillator circuit of claim 1, wherein the control signal comprises a first state indicating a discharge instruction when the output voltage is greater than the reference voltage, and comprises a second state indicating a charge command when the output voltage is less than the reference voltage.

3. The trimmable oscillator circuit of claim 1, wherein the selectively trimmable charge/discharge circuit comprises a selectively trimmable charge circuit operable to exhibit a resistance having a value which is a function of the one or more user selectable control signals, and forming an RC network in which a rate of charge of the output capacitor is a function of the resistance value, thereby influencing a frequency of the output signal at the output capacitor node.

4. A trimmable oscillator circuit, comprising:
   a comparator circuit operable to compare an output voltage of the oscillator circuit to a reference voltage and output a control signal in response thereto;
   an output capacitor, wherein a voltage at a node of the capacitor comprises the output voltage of the oscillator circuit; and
   a selectively trimmable charge/discharge circuit coupled between the comparator circuit and the output capacitor, and operable to charge or discharge the output capacitor based on the control signal, and wherein a rate of charge or discharge is dictated by one or more user selectable control signals, thereby dictating a frequency of the output voltage,
   wherein the selectively trimmable charge/discharge circuit comprises a selectively trimmable charge circuit operable to exhibit a resistance having a value which is a function of the one or more user selectable control signals, and forming an RC network in which a rate of charge of the output capacitor is a function of the resistance value, thereby influencing a frequency of the output signal at the output capacitor node, and
   wherein the selectively trimmable charge circuit comprises:
      a plurality of differing value resistances which are selectively coupled between a circuit supply potential and the node of the output capacitor through a base charge resistance; and
      a charge control circuit enabled by a state of the control signal, and operable to couple one of the plurality differing value resistances to the base charge resistance based on the one or more user selectable control signals, thereby providing a unique charging resistance value which is a function of the one or more user selectable control signals.

5. The trimmable oscillator circuit of claim 4, wherein the plurality of differing value resistances which are selectively coupled between the circuit supply potential and the node of the output capacitor comprises:
   a plurality of parallel-coupled components, wherein each component comprises a resistor having a unique resistance value and a transistor connected in series therewith, wherein a gate of the transistors are coupled to the one or more user selectable control signals and thus a conduction of the transistors is controlled thereby, and wherein one of the components has a resistance value of approximately zero.

6. The trimmable oscillator circuit of claim 5, wherein the charge control circuit comprises a plurality of logic gates which are enabled by the control signal and which generate a transistor conduction signal for one of the plurality of parallel-coupled components, thereby turning on the transistor associated therewith and coupling the resistor having the unique resistance associated therewith to the base charge resistance and together forming the unique charge resistance value.

7. A trimmable oscillator circuit, comprising:
   a comparator circuit operable to compare an output voltage of the oscillator circuit to a reference voltage and output a control signal in response thereto;
   an output capacitor, wherein a voltage at a node of the capacitor comprises the output voltage of the oscillator circuit; and
   a selectively trimmable charge/discharge circuit coupled between the comparator circuit and the output capacitor, and operable to charge or discharge the output capacitor based on the control signal, and wherein a rate of charge or discharge is dictated by one or more user selectable control signals, thereby dictating a frequency of the output voltage,
   wherein the selectively trimmable charge/discharge circuit comprises a selectively trimmable discharge circuit operable to exhibit a resistance having a value which is a function of the one or more user selectable control signals, and forming an RC network in which a rate of discharge of the output capacitor is a function of the resistance value, thereby influencing a frequency of the output signal at the output capacitor node.

8. The trimmable oscillator circuit of claim 7, wherein the selectively trimmable discharge circuit comprises:
   a plurality of differing value resistances which are selectively coupled between the node of the output capacitor through a base discharge resistance, and a circuit ground potential; and
   a discharge control circuit enabled by a state of the control signal, and operable to couple one of the plurality differing value resistances to the base discharge resistance based on the one or more user selectable control signals, thereby providing a unique discharging resistance value which is a function of the one or more user selectable control signals.

9. The trimmable oscillator circuit of claim 8, wherein the plurality of differing value resistances which are selectively coupled between the node of the output capacitor and the circuit ground potential comprises:

a plurality of parallel-coupled components, wherein each component comprises a resistor having a unique resistance value and a transistor connected in series therewith, wherein a gate of the transistors are coupled to the one or more user selectable control signals and thus a conduction of the transistors is controlled thereby, and wherein one of the components has a resistance value of approximately zero.

10. The trimmable oscillator circuit of claim 9, wherein the discharge control circuit comprises a plurality of logic gates which are enabled by the control signal and which generate a transistor conduction signal for one of the plurality of parallel-coupled components, thereby turning on the transistor associated therewith and coupling the resistor having the unique resistance associated therewith to the base discharge resistance and together forming the unique discharge resistance value.

11. A trimmable oscillator circuit, comprising:

a comparator circuit operable to compare an output voltage of the oscillator circuit to a reference voltage and output a control signal in response thereto;

an output capacitor, wherein a voltage at a node of the capacitor comprises the output voltage of the oscillator circuit;

a selectively trimmable charge/discharge circuit coupled between the comparator circuit and the output capacitor, and operable to charge or discharge the output capacitor based on the control signal, and wherein a rate of charge or discharge is dictated by one or more user selectable control signals, thereby dictating a frequency of the output voltage, and a reference voltage generation circuit coupled to the comparator circuit, and operable to provide a reference voltage having a first value when the control signal comprises a first state, and a second value when the control signal comprises a second state.

12. The trimmable oscillator circuit of claim 11, wherein the reference voltage generation circuit comprises a resistor divider network, wherein a resistance of a component therein is a function of the state of the control signal, thereby altering the reference voltage value associated therewith.

13. The trimmable oscillator circuit of claim 12, wherein the resistor divider network comprises:

a first resistance value coupled between a reference voltage node and a circuit ground potential; and a second, variable resistance value coupled between the reference voltage node and a circuit supply potential, wherein a resistance thereof varies based on the state of the control signal.

14. The trimmable oscillator circuit of claim 13, wherein the second, variable resistance value comprises:

a first resistor coupled between the reference voltage node and the circuit supply potential; and a second resistor connected in series with a transistor, wherein the second resistor and the transistor are coupled in parallel with the first transistor, and wherein a conduction of the transistor is dictated by the state of the control signal, thereby varying the second resistance value between a value of the first resistor and a value of the first and second resistors in parallel.

15. A low voltage trimmable RC oscillator circuit, comprising:

a comparator circuit operable to generate a control signal based on a comparison between an oscillator output voltage and a reference voltage;

a charge/discharge circuit operable to selectively serially couple a charge resistance or a discharge resistance to a capacitor to form an RC network, wherein a rate of charge or discharge of the capacitor is a function of a magnitude of the charge resistance or the discharge resistance, respectively; and a control circuit operable to dictate a charge mode or a discharge mode of the charge/discharge circuit based on the control signal and further operable to adjust the magnitude of the charge resistance or the discharge resistance, respectively, based on one or more oscillation frequency control signals, wherein the control circuit comprises eight logic gates each having three inputs coupled to three oscillation frequency control signals, respectively, and wherein one of the eight logic gate outputs a resistance control signal based on a state of the oscillation frequency control signals, thereby enabling a coupling of a resistance value in a charge path or a discharge path, respectively.

16. The low voltage trimmable RC oscillator circuit of claim 15, wherein the control circuit further comprises selectively enabled control gates operable to pass the resistance control signal to a charge portion of the charge/discharge circuit or a discharge portion of the charge/discharge circuit based on the control signal.

17. The low voltage trimmable RC oscillator circuit of claim 16, wherein the charge portion of the charge/discharge circuit comprises eight parallel-coupled components, wherein each component comprises a unique resistance in series with a transistor, and wherein one of the eight parallel-coupled components is activated by turning on the respective transistor via the resistance control signal, thereby coupling the unique resistance associated therewith to the capacitor.

18. The low voltage trimmable RC oscillator circuit of claim 16, wherein the discharge portion of the charge/discharge circuit comprises eight parallel-coupled components, wherein each component comprises a unique resistance in series with a transistor, and wherein one of the eight parallel-coupled components is activated by turning on the respective transistor via the resistance control signal, thereby coupling the unique resistance associated therewith to the capacitor.

* * * * *